US006114094A

United States Patent [19]

Ishiguro et al.

[11] Patent Number: 6,114,094

[45] Date of Patent: Sep. 5, 2000

[54] PROCESS FOR MAKING LITHOGRAPHIC PRINTING PLATE

[75] Inventors: Hideaki Ishiguro; Akio Yoshida; Yuji Takagami, all of Tokyo, Japan

[73] Assignee: Mitsubishi Paper Mills Limited, Tokyo, Japan

[21] Appl. No.: 09/275,446

[22] Filed: Mar. 24, 1999

[30] Foreign Application Priority Data

| | | | |
|---|---|---|---|
| Mar. 25, 1998 | [JP] | Japan | 10-077236 |
| Mar. 16, 1999 | [JP] | Japan | 11-069786 |

[51] Int. Cl.$^{7}$ .......... G03F 7/20; G03F 7/36; G03F 7/11

[52] U.S. Cl. .......... 430/302; 430/204; 430/271.1; 430/272.1; 430/330; 430/328; 430/616; 430/964

[58] Field of Search .......... 430/204, 616, 430/964, 302, 328, 272.1, 271.1, 330

[56] References Cited

U.S. PATENT DOCUMENTS

| | | | |
|---|---|---|---|
| 3,971,660 | 7/1976 | Staehle | 430/204 |
| 4,278,756 | 7/1981 | Bouldin et al. | 430/616 |
| 5,401,611 | 3/1995 | Edwards, Sr. et al. | 430/616 |
| 5,916,734 | 6/1999 | Takagami et al. . | |

FOREIGN PATENT DOCUMENTS

| | | |
|---|---|---|
| 10-180976 | 7/1998 | Japan . |

*Primary Examiner*—Richard L. Schilling
*Attorney, Agent, or Firm*—Pillsbury Madison & Sutro LLP

[57] ABSTRACT

There is disclosed a process for making a lithographic printing plate which comprises subjecting a lithographic printing plate precursor having at least a hydrophilic layer on a support and a silver thin layer on the hydrophilic layer to exposure by a laser beam whereby imagewisely removing the silver thin layer and exposing the hydrophilic layer, wherein the hydrophilic layer adjacent to the silver thin layer contains at least one inorganic oxide.

17 Claims, No Drawings

PROCESS FOR MAKING LITHOGRAPHIC PRINTING PLATE

BACKGROUND OF THE INVENTION

This invention relates to a process for making a lithographic printing plate, more specifically to a process for making a lithographic printing plate which can be handled under a room light, can image with a laser under heat-mode, can provide an image with high resolution and generates no waste liquid by the plate-making method of a lithographic printing material.

A lithographic printing plate comprises an oleophilic image area which accepts oily ink, and an oil-repellent non-image area which does not accept ink. The non-image area generally comprises a hydrophilic portion which accepts water. In a usual lithographic printing plate, printing is carried out by supplying both of water and an ink to a plate surface whereby the image area selectively accepts the ink and the non-image area selectively accepts water, and transferring the ink on the image area to a material to be printed such as paper, or the like.

A lithographic printing plate has now been prepared by forming an oleophilic ink receptive layer on a substrate such as an aluminum plate, a zinc plate, paper or the like, the surface of which are subjected to hydrophilic treatment. Among these, it is general to use those in which a photosensitive material such as a diazo compound or a photopolymer, etc. is provided on an aluminum base the surface of which is subjected to hydrophilic treatment which is so-called a presensitized (PS) plate, or those in which an image is formed by utilizing a silver complex diffusion transfer process (the DTR method) using a silver halide on paper or a plastic support as a photosensitive material.

A method for forming an ink receptive layer (hereinafter referred to as "an image layer") by a diazo compound or a photopolymer comprises firstly coating a photosensitive material such as a diazo compound, a photopolymer or the like on a substrate such as a metal plate, paper, a laminated plate, an insulating substrate, or the like. Then, light is exposed to the photosensitive material to cause chemical change whereby dissolution properties to a developing solution are changed. Here, the photosensitive material can be divided into two types depending on the kind of the chemical change. That is, one is a negative type in which the portion to which light is exposed is polymerized and cured to become insoluble to a developing solution, and the others is a positive type in which a functional group at the portion to which light is exposed is changed to have solubility in a developing solution. In either of the case, the photosensitive material insoluble in a developing solution, which remains on the substrate after processing with a developing solution, becomes an image layer.

On the other hand, a lithographic printing plate using the DTR method, particularly a lithographic printing plate having a physical development nuclei layer on a silver halide emulsion layer is described in, for example, U.S. Pat. Nos. 3,728,114, No. 4,134,769, No. 4,160,670, No. 4,336,321, No. 4,501,811, No. 4,510,228 and No. 4,621,041. Exposed silver halide microcrystals cause chemical development by the DTR developer and change to black silver to form a hydrophilic non-image area. On the other hand, unexposed silver halide microcrystals become silver complex by a complexing agent in a developing solution to diffuse to a physical development nuclei layer at the surface thereof and cause physical development in the presence of a nucleus whereby an image area mainly comprising ink receptive physically developed silver is formed. Also, a lithographic printing plate in which a physical development nuclei layer and a silver halide emulsion layer are coated in this order on a grained and anodized aluminum support is disclosed in, for example, Japanese Provisional Patent Publications No. 260491/1988, No. 116151/1991, No. 282295/1992 or the like. The above-mentioned lithographic printing plate is imagewisely exposed, followed by DTR development, the silver halide emulsion layer is washed with warm water to form an image area mainly comprising the physically developed silver on the anodized aluminum base.

As a plate-making step of the process for making these printing plates, in the past, it was a main stream to prepare an intermediate film or a block copy from letters, images or photographic copies, gathering these to a plate to prepare a finishing film and then to use close contact exposure system with an ultraviolet ray or a white light. Also, a method of laminating block copies to prepare a complete block copy and photographing it with a camera for plate making has been used. However, accompanying with the progress of computer technology, it has been employed a laser direct imaging system in which digital signal from computer information is transferred to an exposure device (computer to plate) and a photosensitive material is directly exposed by using a laser. The laser direct imaging system has advantages of low cost, time-saving, high productivity in many kinds of products with a small size or the like since films to be used in the course of the processing can be omitted.

In order to be applied with the laser direct imaging system, a photosensitive material having a high sensitivity is preferably used. In a diazo compound or a photopolymer, their sensitivities are low as several to several hundreds $mJ/cm^2$ since a photochemical reaction occurs. Thus, to use the material for exposure, a laser output apparatus is required to be high power output whereby there are problems that the apparatus becomes large or a cost becomes expensive.

On the other hand, when an image is formed by the DTR method using a silver halide, its sensitivity is several $\mu J/cm^2$ so that exposure can be carried out sufficiently with a simple and easy semiconductor laser or the like. However, there is a defect that efficiency and plate-making operations become markedly poor since storage, coating to a substrate or the like before subjecting to exposure must be carried out under a safety light. Further, in the case of the diazo compound or the photopolymer, the reaction proceeds by a room light or sunlight and their reactivities change at a high temperature. Moreover, when an oxygen is present, it becomes an inhibitor of the reaction. Thus, it is necessary to treat under a dark room or store at a low oxygen condition until exposure and development are carried out.

Furthermore, in the above image formation methods, it is general to carry out processing with a liquid using a developing solution so that there is a defect that treatment of the waste solution becomes environmental issue. From 1995, a waste liquid is prohibited to throw into the ocean and processing with a dried state is earnestly desired today.

As a material which satisfies the above demand, it has been proposed a printing plate of a system in which image formation is carried out by providing an oleophilic metal thin layer on a support having a hydrophilic surface and imagewisely removing the oleophilic metal thin layer with irradiation of a high output heat-mode laser beam. For example, in Japanese Provisional Patent Publication No. 180976/1998, it is disclosed a process for making a plate by effecting a heat-mode laser exposure of a printing plate precursor in which a silver thin layer is formed on a support having a hydrophilic layer by DTR development without effecting development.

For making such a printing plate precursor, the silver complex diffusion transfer process is effective as a method for forming a silver thin film on a support. As the first system, there is a system in which a material wherein a physical development nuclei layer is provided on a support and a material wherein a silver halide emulsion layer is coated on a support as a donor for a silver complex salt are passed through a physical developer, piled up and subjecting to diffusion transfer development to precipitate silver on physical development nuclei to form a silver thin layer. Examples of the material using the system of forming a silver thin film as mentioned above may include Copy rapid (trade name, available from Agfa Gevaert) or the like.

As the second system, a material, in which a silver halide emulsion layer is provided as a donor for the silver complex salt on a support to which a physical development nuclei layer is provided, is subjected to physical development processing, and then, the silver halide emulsion layer is washed-off to form a silver thin film on the physical development nuclei. Examples of employing such a system to form a silver thin film may include Silver Digiplate SDP-αR (trade name, available from Mitsubishi Paper Mills Ltd.), Silverlith SDB (trade name, available from E.I. Du Pont) or the like.

However, according to the above two-types of the systems, there are problems that preparation of the silver halide emulsion layer is troublesome, preparation of the silver thin film requires dark room and the like.

As the third system, a support to which a physical development nuclei layer is provided is immersed in a solution containing a silver complex salt dissolved by a silver halide solvent, and a reducing agent, to form a silver thin layer on the physical development nuclei. This system has been also known as the electroless plating system, and disclosed in, for example, Japanese Patent Publications No. 23745/1967 and No. 12862/1968, and Japanese Provisional Patent Publication No. 287542/1993.

However, according to these methods disclosed in the prior art references, there are drawbacks that desired printability cannot be obtained, a silver film is required to be formed within a shorter time and the like.

SUMMARY OF THE INVENTION

An object of the present invention is to provide a process for making a lithographic printing plate which can handle under a room light, is suitable for a direct imaging method by a laser beam, can provide an image with high resolution and generates no waste liquid by the plate-making method of a lithographic printing material.

Another object of the present invention is to provide a process for making a lithographic printing plate in which an ink/water response is improved when a film or a polyethylene-coated paper is used as a support.

The present inventors have intensively studied to overcome the above-mentioned problems, and as a result, they have found the following invention.

The process for making a lithographic printing plate of the present invention comprises subjecting a lithographic printing plate precursor having at least a hydrophilic layer on a support and a silver thin layer on said hydrophilic layer to exposure by a laser beam whereby imagewisely removing said silver thin layer and exposing said hydrophilic layer, wherein the hydrophilic layer adjacent to said silver thin layer contains at least one inorganic oxide.

DESCRIPTION OF THE PREFERRED EMBODIMENTS

In the present invention, the silver thin layer area is hydrophobic, and the hydrophilic layer exposed area is hydrophilic as a matter of course. Thus, due to the presence or absence of heat-mode exposure, difference occurs on the surface of the lithographic printing plate as an ink-receptive area and an ink-repellent (water-acceptance) area. That is, when a plate is prepared according to the process for making a lithographic printing plate of the present invention, the silver thin layer heated by the laser beam exposure is thermally fused or melted to become fine particles (and thereafter these fine particles are removed by using a removing apparatus, if necessary), whereby the hydrophilic layer thereunder exposed to become a non-image portion which repels an ink but accepts water. On the other hand, at the portion which is not heated, the silver thin layer remains so that it becomes an image portion which accepts ink whereby lithographic printing can be carried out.

However, accompanying with heat fusion of the silver thin layer by the laser beam exposure, at the neighbor of the surface of the hydrophilic layer adjacent to the silver thin layer is also heated to a high temperature. Thus, if the heat resistance of the material constituting the surface of the hydrophilic layer is poor, the surface characteristics of the hydrophilic layer possessed by the layer before exposure are changed by heating whereby stain at printing is likely induced.

Also, even if there is no apparent change in hydrophilicity of the hydrophilic layer, if the hydrophilic layer is deteriorated by high temperature heating and is likely peeled off from a support, stain at printing is likely caused when the support is a film or polyethylene-coated paper since the support surface does not essentially have hydrophilicity which can endure printing.

In this point, an inorganic oxide generally has heat resistance and thus, it is thermally extremely stable. Thus, by adding the inorganic oxide to the hydrophilic layer, change in characteristics at printing can be prevented.

Among the present invention, in a process for making a lithographic printing plate of the second invention, the inorganic oxide is at least one of an oxide of elements selected from the group consisting of aluminum, silicon, zirconium and titanium.

By adding an oxide of these elements to the hydrophilic layer, thermal change of the hydrophilic layer can be prevented, and according to the hydrophilic properties possessed by these inorganic oxides, excellent ink/water responses can be provided to the lithographic printing plate at printing.

Among the present invention, in a process for making a lithographic printing plate of the third invention, the particle size of said inorganic oxide is 0.001 to 0.1 μm.

If the particle size is greater than 0.1 μm, it is difficult to form a uniform film at the area adjacent to the silver thin layer, and consequently there cause an area which is easily removable and an area which is difficultly removable in the silver thin layer at exposure to laser whereby unevenness occurs in removability.

By using an inorganic oxide having a particle size of 0.001 to 0.1 μm. a uniform and firm film can be formed as the hydrophilic layer whereby thermal loss can be uniformly prevented over the whole hydrophilic layer and removability of the silver thin layer can be made uniform. According to this, an image having high resolution can be obtained.

Among the present invention, in a process for making a lithographic printing plate of the fourth invention, the silver thin layer of said lithographic printing plate precursor comprises a physical development silver formed by the silver complex diffusion transfer process.

The silver thin layer which is physically developed by the silver complex diffusion transfer process has higher laser absorption ratio and hydrophilicity as compared with the silver thin layer formed by the deposition method, etc., whereby removal efficiency of the silver thin film by laser beam exposure is improved and an ink receptivity of the image area silver thin film becomes high so that the characteristics as the lithographic printing plate are improved.

Among the present invention, in a process for making a lithographic printing plate of the fifth invention, the silver thin layer is formed by providing a hydrophilic physical development nuclei layer containing an oxide of at least one element selected from the group consisting of aluminum, silicon, zirconium and titanium, and at least one of silver halide emulsion layer on a support in this order, subjecting to developing treatment by the silver complex diffusion transfer process without effecting exposure, and subjecting to wash-off the silver halide emulsion layer to form a physical development silver on the physical development nuclei in a layered state.

In such a layer constitution, the physical development nuclei layer also acts as the above-mentioned hydrophilic layer, and a hydrophilic layer containing an inorganic oxide may be further provided between the physical development nuclei layer and the support.

In this method, hydrophilicity of the exposed surface can be markedly improved and excellent ink/water response can be obtained. Detailed mechanism thereof has not yet been clear but it can be considered that the silver thin film and an oxide of the above element which is an inorganic oxide exist extremely close to each other and the ratio of such a configuration becomes large whereby thermal damage of the hydrophilic layer becomes little.

Among the present invention, in a process for making a lithographic printing plate of the sixth invention, the inorganic oxide in said hydrophilic layer is contained in an amount of 50% by weight or more.

Accompanying with increase in the content of the inorganic oxide in the hydrophilic layer, the ratio of extremely closely existing ratio of the silver thin layer and the inorganic oxide increases. When the weight ratio of the inorganic oxide becomes 50% or more, thermal change in the hydrophilic layer can be markedly controlled and more excellent ink/water response at the time of initiating printing can be obtained.

Among the present invention, in a process for making a lithographic printing plate of the seventh invention, the silver thin layer is constituted by granular silver particles having an average particle size of 0.005 to 0.2 μm.

The silver thin layer comprising such silver particles can be easily removed by a heat mode laser exposure and printability is also excellent.

Among the present invention, in a process for making a lithographic printing plate of the eighth invention, said granular silver particles are formed in the presence of a silver halide solvent.

The silver thin layer thus prepared has excellent ink receptivity.

Among the present invention, in a process for making a lithographic printing plate of the ninth invention, said silver halide solvent is an amine compound.

The silver thin layer thus prepared has more excellent ink receptivity.

Among the present invention, in a process for making a lithographic printing plate of the tenth invention, said amine compound is a compound represented by the formula (I):

(I)

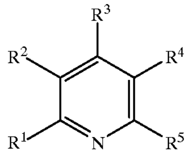

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, acyl group, aroyl group or heterocyclic group, or adjacent two of these substituents may form a ring.

Among the present invention, in a process for making a lithographic printing plate of the eleventh invention, a hydrophilic polymer layer having a thickness of 0.01 to 0.5 μm is further provided on said silver thin layer of the lithographic printing plate.

The hydrophilic polymer layer has a role of preventing deterioration in sensitivity accompanied by modification of the silver thin layer surface with a lapse of time. Also, whereas the hydrophilic polymer has light transmittance at the infrared spectral region, when a hydrophilic polymer layer is present on the silver thin layer, it causes a bad effect on the removal sensitivity of the silver thin layer. However, when the thickness of the hydrophilic polymer layer is within the above range, the sensitivity is substantially not lowered.

Among the present invention, in a process for making a lithographic printing plate of the twelfth invention, said hydrophilic polymer layer contains 1 to 30% by weight of a hydrophobic compound.

When the content of the hydrophobic compound in the hydrophilic polymer layer is within the above range, ink acceptability can be improved without substantially impairing removal efficiency of the silver thin layer.

Among the present invention, in a process for making a lithographic printing plate of the thirteenth invention, said hydrophobic compound is a compound having a mercapto group and at least one of a hydrophobic substituent.

If the hydrophobic compound is a compound having a mercapto group and at least one of a hydrophobic substituent, it has an interaction with the silver thin layer surface whereby ink acceptability can be improved and stabilized.

Among the present invention, in a process for making a lithographic printing plate of the fourteenth invention, after exposing the hydrophilic layer by laser beam exposure, i.e., after laser beam exposure, and, if desired, further removing the silver thin layer residue remained on the hydrophilic layer, UV exposure is carried out at least on the hydrophilic layer.

Among the inorganic oxides, there is a substance which can control the surface characteristics, particularly hydrophilic/hydrophobic characteristics by UV exposure. Thus, by carrying out UV exposure to the hydrophilic layer containing such an inorganic oxide, a contact angle of the hydrophilic layer can be lowered whereby good printed material with less printing stain can be obtained.

Among the present invention, in a process for making a lithographic printing plate of the fifteenth invention, UV exposure is carried out to the lithographic printing plate precursor during after laser beam exposure and before initiation of printing.

By effecting UV exposure during after laser beam exposure and before initiation of printing, hydrophilicity of the hydrophilic layer which is an non-image area can be improved without lowering adhesiveness of the silver thin layer which is an image area.

Among the present invention, in a process for making a lithographic printing plate of the sixteenth invention, UV exposure is carried out to the lithographic printing plate precursor during laser beam exposure.

By effecting UV exposure during laser beam exposure, the hydrophilic layer exposed by laser beam exposure is then exposed to UV rays whereby hydrophilicity of the hydrophilic layer which is a non-image area can be improved without elongating the total plate-making time.

Among the present invention, in a process for making a lithographic printing plate of the seventeenth invention, as the support for the lithographic printing plate precursor of the present invention, a film or a polyethylene-coated paper is used.

A film or a polyethylene-coated paper is inexpensive than an aluminum base but inferior in hydrophilicity at the surface thereof than the aluminum base in which the surface treatment is carried out to make the surface hydrophilic. Thus, it was inferior in various printability including an ink/water response. However, even when a film or a polyethylene-coated paper is used as a support, hydrophilicity at the non-image area is improved by providing a hydrophilic layer containing an inorganic oxide, and an ink/water response corresponding to the aluminum base in which the surface treatment is carried out to make the surface hydrophilic can be obtained. Moreover, the inorganic oxide can improve physical strength of the hydrophilic layer so that runlength is also improved.

Among the present invention, in a process for making a lithographic printing plate of the eighteenth invention, imaging is carried out by using a laser having an output power on said lithographic printing plate precursor of 0.1 to 10 W, and a silver amount in said silver thin layer is 0.1 to 1.5 $g/m^2$.

An amount of silver in the silver thin layer markedly affects on the removability of the silver thin film at imaging laser and print ability at the time of printing. If an amount of silver in the silver thin layer is larger than 1.5 $g/m^2$, removability at imaging becomes poor, and silver remains on the surface of the hydrophilic surface, as a result, stain at printing is induced. On the other hand, if the amount of silver in the silver thin layer is less than 0.1 $g/m^2$, removability is improved and the hydrophilic surface is exposed, but runlength becomes worse at printing. Thus, by making the silver amount in the silver thin layer 0.1 to 1.5 $g/m^2$, a lithographic printing plate in which both of removability and printability at imaging are well balanced and both excellent can be prepared.

According to the present invention, by heating the area which becomes a non-image area by a laser beam in accordance with the desired images to be prepared, a lithographic printing plate can be prepared without using a liquid developer or a devices to be used for subjecting to these treatments. Moreover, operations under light room can be carried out during the plate-making step from the lithographic printing plate precursor and the printing step can be realized, and long term preservation under light room or oxygen becomes possible stably.

The lithographic printing plate precursor according to the present invention has at least one hydrophilic layer on a support, and a silver thin layer is further provided thereon. As the process for making a lithographic printing plate of the present invention, irradiation with a laser beam is imagewisely carried out to the lithographic printing plate (non-image portion exposure). Here, the silver thin layer is removed (ablation) by laser beam exposure, or after laser beam exposure, a residue remained at the exposed portion of the printing plate precursor is removed by a means such as vacuum evacuation, or the like, or else, silver particles are granulated, making a plate is completed by finally exposing the hydrophilic layer at the area which becomes non-image area. Thereafter, when it is mounted on a lithographic printer, ink is accepted by the area of the remaining silver thin layer and water is accepted by the exposed hydrophilic layer whereby printing can be carried out.

The hydrophilic layer according to the lithographic printing plate of the present invention contains at least one of inorganic oxides.

In the present invention, the inorganic oxide means a compound in which it has at least an area which directly bonds to oxygen, and in addition to an oxide, it represents a hydroxide, hydrated oxide, and a complex compound thereof. As the elemental component of such an inorganic oxide, there may be mentioned aluminum, silicon, zirconium, titanium, beryllium, zinc, iron, tin, barium, silver, strontium, bismuth, tungsten, etc. In the inorganic oxide according to the present invention, it may contain at least one of these elements and those which contain two or more kinds thereof such as alumina silicate, etc. are also included. Specific examples of such inorganic oxide may include, for example, inorganic oxides such as aluminum oxide, silicon dioxide, zirconium oxide, titanium dioxide, beryllium oxide, zinc oxide, iron oxide, tin oxide, barium oxide, silver oxide, strontium oxide, bismuth oxide and tungsten oxide; inorganic hydroxides such as aluminum hydroxide, silicon hydroxide, zirconium hydroxide, titanium hydroxide, beryllium hydroxide, zinc hydroxide, iron hydroxide, tin hydroxide, barium hydroxide, silver hydroxide, strontium hydroxide, bismuth hydroxide and tungsten hydroxide; hydrated inorganic oxides of the above mentioned inorganic oxides; and a composite compound thereof.

These inorganic oxides according to the present invention used in the form of fine particles preferably, are excellent in heat resistance and difficult to dissolve in a solvent of an ink and a fountain solution. Preferred particle size of the inorganic oxide according to the present invention is 0.001 to 0.1 $\mu$m, more preferably 0.005 to 0.05 $\mu$m. Also, in the conventional silver salt printing plate using a film or a paper based support, improvement in runlength or hydrophilicity is carried out by using an inorganic oxide such as silicon dioxide or titanium dioxide having a relatively large particle size such as 0.1 to 10 $\mu$m to make unevenness on the surface of the hydrophilic layer, these inorganic oxides may be used in combination with the inorganic oxides of the present invention.

Among these inorganic oxides, in view of hydrophilicity and an ink/water response at printing, at least one oxide of an element selected from the group consisting of aluminum, silicon, zirconium and titanium is particularly preferred. In the present invention, an inorganic oxide is used in the form of a dispersant, as such a dispersant, alumina sol, colloidal silica, titania sol and zirconia sol are preferably used. These sols may be an aqueous sol or may be an organo sol using an organic solvent. These materials may be used singly or in combination of two or more kinds having different compositions, grain sizes, etc.

The inorganic oxide according to the present invention may be subjected to surface-modification treatment with a suitable surface modifier to improve ionic property or dispersibility. As the surface modifier, there may be used, for example, various kinds of ionic species, various kinds of surfactants, and coupling agents containing silicon, titanium, aluminum, etc. Moreover, as the dispersibility stabilizer, a cation derived from an alkali metal or ammonium, etc., or an anion derived from acetic acid, hydrochloric acid, nitric acid, sulfuric acid, etc. may be contained.

When the inorganic oxide according to the present invention forms a film itself, or forms an inorganic oxide film having runlength in combination with a hardening agent, if desired, then the hydrophilic layer according to the present invention may comprise an inorganic oxide. Also, in the hydrophilic layer according to the present invention, a hydrophilic polymer, etc. may be used in combination. When the hydrophilic polymer, etc. is used, a weight ratio (content) of the inorganic oxide in the hydrophilic layer according to the present invention is preferably 50% by weight or more. The thus prepared hydrophilic layer can markedly control thermal changes of the hydrophilic layer by laser beam exposure, and not only excellent in stain resistance at printing but also excellent ink/water response. More preferred content of the inorganic oxide is 70% by weight or more, further preferably 80% by weight or more.

As the hydrophilic polymer to be used in the hydrophilic layer according to the present invention, the following examples may be mentioned. These materials may be used in combination of two or more kinds in view of printabilities such as background stain or runlength.

As the natural materials, there may be mentioned those obtained from algae such as starches, marine algae mannan, agar and sodium alginate; vegetable viscose material such as mannan, pectin, tragacanth gum, Karaya gum, xanthine gum, guiac bean gum, Locust bean gum and gum arabic; microorganism viscose materials including homopolysaccharides such as dextran, glucan, xanthane gum and levan; and heteropolysaccharides such as succinoglucan, pullulan, Curdlan and xanthane gum; proteins such as glue, gelatin, casein and collagen; chitin and derivatives thereof, and the like.

Also, as the semi-natural (semi-synthesized) materials, there may be mentioned modified gums such as cellulose derivatives, and carboxymethyl guiac bean gum; modified starches including roasted starches such as dextrin; oxidized starches, esterified starches, and the like.

As the synthesized materials, there may be mentioned polyvinyl alcohol, modified polyvinyl alcohols such as partially acetalized polyvinyl alcohol, allyl-modified polyvinyl alcohol, polyvinyl methyl ether, polyvinyl ethyl ether, polyvinyl isobutyl ether, etc; polyacrylic acid derivatives and polymethacrylic acid derivatives such as polyacrylic acid salts, partially saponified product of polyacrylates, polymethacrylic acid salts, and polyacrylamides; polyethylene glycol, polyethylene oxide, polyvinyl pyrrolidone, vinyl pyrrolidone/vinyl acetate copolymer, carboxy vinyl polymerized material, styrene/maleic acid copolymer, styrene/crotonic acid copolymer, and the like.

Among these, for forming the silver thin film by the silver complex diffusion transfer process, when the hydrophilic layer is used also as a silver halide emulsion layer, gelatin is preferably used.

As the gelatin to be used in the hydrophilic layer according to the present invention, any gelatin which is prepared from animal collagen as a starting material can be used, but preferably gelatin which is prepared from collagen obtained from pigskin, cattle skin, and cattle bone. Also, there is no specific limitation about the kind of gelatin, but in addition to lime-treated gelatin and acid-treated gelatin, gelatin derivatives as disclosed in Japanese Patent Publications No. 4854/1963, No. 5514/1964, No. 12237/1965 and No. 26345/1967; U.S. Pat. Nos. 2,525,753, No. 2,594,293, No. 2,594,293, No. 2,614,928, No. 2,763,639, No. 3,118,766, No. 3,132,945, No. 3,186,846, No. 3,312,553, and British Patent No. 1,033,189. These materials may be used singly or in combination of two or more.

When gelatin is used as a hydrophilic layer, it can be cured by a gelatin curing agent. As the gelatin curing agent, there may be mentioned, for example, inorganic compounds such as chromium alum; aldehydes such as formalin, glyoxal, malealdehyde and glutaraldehyde; N-methylal compounds such as urea, ethylene urea, etc.; aldehyde analogue compounds such as mucochloric acid and 2,3-dihydroxy-1,4-dioxane; compounds having an active halogen such as 2,4-dichloro-6-hydroxy-S-triazine salt and 2,4-dihydroxy-6-chloro-S-triazine salt: divinyl sulfone, divinyl ketone, N,N,N-triacryloylhexahydrotriazine, compounds having an ethyleneimino group which is an active three-membered ring or at least two epoxy groups in the molecule, and dialdehyde starches as a polymer hardening agent, or the like, and these compounds may be used singly or in combination of two or more.

Also, the hydrophilic layer according to the present invention can be formed by dissolving or dispersing a hydrophilic layer constituting composition in a suitable solvent, and coating it onto a support which is used as a lithographic printing plate precursor, followed by drying. To prepare a coating solution for forming a hydrophilic layer well, or to improve coating property, at least one of an anionic, cationic or nonionic surfactant may be used as a coating aid, and a matte agent, a thickening agent or an antistatic agent may also be used in combination.

The silver thin layer according to the present invention can be formed by a generally known means for forming a metal thin film such as vacuum deposition, sputtering, CVD (Chemical Vapor Deposition), plating, etc. On the other hand, the silver thin layer can be formed by using the method of physical development using the silver complex salt diffusion transfer process. In this method, when it is used as a printing plate, not only pure metal silver but also so-called lipophilic contaminants such as oxides, sulfide, etc. are mixedly present in the silver thin layer which becomes an image area, and surface unevenness is suitably formed in microscopic view whereas it is a continuous film. Thus, adsorption of ink prepared by this method becomes better than those prepared by other methods, and a laser absorption ratio becomes high and sensitivity as the lithographic printing material is also increased. Moreover, it is preferred in the point that industrial mass production can be easily carried out.

In the present invention, a silver thin layer comprising silver particles having an average particle size of 0.005 to 0.2 μm is preferably used. The silver thin layer comprising such silver particles is easily removed by exposure using a heat-mode laser beam and its printability is also excellent. In the silver thin layer comprising silver particles having an average particle size of more than 0.2 μm or the silver thin layer comprising silver particles having an average particle size of less than 0.005 μm prepared by vacuum deposition, ink acceptability of the silver thin layer is poor so that image quality of the printed matter becomes also poor.

In the present invention, three types of systems of the silver complex diffusion transfer processes have been known as preferred methods for preparing a silver thin layer. Among these three types of systems, the first two systems have been practically used in a plate making camera or a photo-mode laser exposing machine. Printability of the silver thin layer formed by these methods depends on plate-constituting elements such as the layer constitution of a plate, a halogen composition of a silver halide emulsion, an average particle size of emulsion particles, a development inhibitor or the like; elements for constituting a diffusion transfer development solution such as a developing agent, a silver halide emulsion, a development inhibitor or the like; and conditions of the diffusion transfer development processing. As for these factors, there are disclosed, for example, in U.S. Pat. Nos. 3,728,114, No. 4,134,769, No. 4,160,670, No. 4,336,321, No. 4,501,811, No. 4,510,228 and No. 4,621,041, Japanese Provisional Patent Publications No. 260491/1988, No. 116151/1991 and No. 282295/1992 or the like. For controlling the silver particles constituting the silver thin layer to 0.005 to 0.2 μm, it can be accomplished by optimizing these known techniques.

As for the third system, it is disclosed in Japanese Patent Applications No. 304390/1997, No. 304391/1997, No. 304392/1997, No. 304393/1997 and No. 304394/1997, and by optimizing the composition of the processing solution constituted by a developing agent, a silver halide solvent, silver salt, etc. according to the techniques disclosed therein, silver particles constituting the silver thin layer can be controlled to 0.005 to 0.2 μm whereby preferred printability can be obtained.

As a method for measuring the particle size of silver particles constituting a silver thin layer, there may be mentioned a method in which the silver thin layer is photographed and the sizes of the respective silver particles in the photograph are measured, and an average value is calculated therefrom. As a simple and easy method, mean-sized particles are picked up and the sizes of these particles may be measured.

In the present invention, it is preferred to use physical development nuclei for preparing a good silver thin film at the time of preparation. As the physical development nuclei, there may be mentioned a metal colloid fine particle of silver, antimony, bismuth, cadmium, cobalt, lead, nickel, palladium, rhodium, gold, platinum, or the like, or a sulfide, a polysulfide, a selenide of these metals, or a mixture thereof, or a mixed crystal thereof.

For forming a layer by previously coating physical development nuclei, a hydrophilic polymer may be used in combination with the physical development nuclei. As the hydrophilic polymer to be used in the physical development nuclei layer, there may be mentioned, for example, gelatin, starch, dialdehyde starch, carboxymethyl cellulose, gum arabic, sodium alginate, hydroxyethyl cellulose, polystyrenesulfonic acid, sodium polyacrylate, a copolymer of vinylimidazole and acrylamide, a copolymer of acrylic acid and acrylamide, a hydrophilic polymer such as polyvinyl alcohol or the like, or an oligomer thereof, and a content thereof is preferably 0.5 $g/m^2$ or less.

To the physical development nuclei layer, a developing agent such as hydroquinone, methyl hydroquinone, catechol, etc., or a known film-hardening agent such as formalin, dichloro-s-triazine, etc. may be further added. Also, in the preferred embodiment of the present invention, at least one of an oxide of an element selected from the group consisting of aluminum, silicon, zirconium and titanium is added to the physical development nuclei layer. These oxides may be the same as those used in the hydrophilic layer according to the present invention.

Also, when a silver halide emulsion layer is provided as a donor of a silver ion for forming a silver thin layer, silver halide such as silver chloride, silver bromide, silver chlorobromide, and silver iodide may be used, and they are used in the form of a crystal. The silver halide crystal may contain a heavy metal salt such as rhodium salt, iridium salt, palladium salt, ruthenium salt, nickel salt, platinum salt, etc., and an amount thereof is $10^{-8}$ to $10^{-3}$ mole per mole of silver halide. Crystal form of the silver halide is not particularly limited, and it may be cubic or tetradecahedral particles, and further core-shell type or tabular particles. The silver halide crystal may be monodispersed or polydispersed crystals and the average particle size thereof is within the range of 0.2 to 0.8 μm. As one of the preferred examples, there maybe mentioned a monodispersed or polydispersed crystals containing 80 mole % or more of silver chloride containing a rhodium salt or an iridium salt.

Also, when preparation of the silver thin film is carried out by using the third method, a kind of a silver ion is not particularly limited, but it is selected from silver nitrite and silver halide such as silver chloride, silver bromide, silver iodide, silver chlorobromide, silver chloroiodide, silver chlorobromoiodide, and the like.

In the present invention, as a reducing agent to be used for preparing the silver thin film, there may be used hydroquinone, phenylenediamine, phenidone, dimethylphenidone, and the like.

A development processing solution for forming a silver thin layer may contain an alkaline substance for adjusting pH such as sodium hydroxide, potassium hydroxide, lithium hydroxide, sodium tertiary phosphate, etc.; or an acidic substance such as sulfuric acid, nitric acid, phosphoric acid, etc.; a preservative such as a sulfite; a silver halide solvent such as a thiosulfate, a thiocyanate, a circular imide, 2-mercaptobenzoic acid, an amine compound, etc; a thickening agent such as hydroxyethyl cellulose, carboxymethyl cellulose etc; an antifoggant such as potassium bromide; a development modifier such as a polyoxyethylene compound, an onium compound etc. Moreover, in the development processing solution, a compound which improves ink receptivity at the surface of the silver thin film may be used as disclosed in U.S. Pat. No. 3,776,728.

In the present invention, when a silver thin layer comprising granular silver particles is to be prepared, it is preferably carried out in the presence of a compound which becomes a silver halide solvent. The silver thin layer thus prepared shows excellent ink receptivity. As the silver halide solvent to be used in the present invention, there may be mentioned, for example, a sulfite (e.g., anhydrous sodium sulfite, anhydrous potassium sulfite, etc.), a thiosulfite (e.g., sodium thiosulfite hexahydrate, ammonium thiosulfite, etc.), and an amine compound or the like. Among the silver halide solvents as mentioned above, the amine compound is preferably used in the present invention. The thus prepared silver thin layer shows more excellent ink receptivity.

In the present invention, the amine compound to be used as a silver halide solvent may include ammonia and those which are substituted by a substituted or unsubstituted and saturated or unsaturated alkyl group, cycloalkyl group, alkoxy group, aryl group, alkanoyl group, aroyl group, or heterocyclic group, and these substituents may be combined to each other to form a ring.

In the following, specific examples of the amine compounds are shown, but the present invention is not limited by them.

| | | | |
|---|---|---|---|
| A1 | $NH_3$ | A2 | $NH_2CH_2CH_3$ |
| A3 | $NH(CH_2CH_3)_2$ | A4 | $N(CH_2CH_3)_3$ |
| A5 | $NH_2CH_2CH_2OH$ | A6 | $NH(CH_2CH_2OH)_2$ |
| A7 | $N(CH_2CH_2OH)_3$ | A8 | $CH_3NHCH_2CH_3$ |
| A9 | $NH_2CH_2CH_2NHCH_2CH_3$ | A10 | $NH_2CH_2CH_2NHCH_2CH_2OH$ |
| A11 | 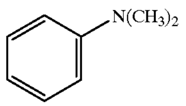 | A12 | 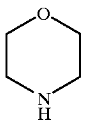 |
| A13 | 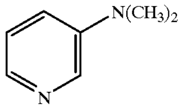 | | |

Also, in the present invention, a compound represented by the following formula (I) is more preferred as the amine compound.

(I)

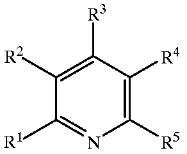

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, acyl group, aroyl group or heterocyclic group, or adjacent two of these substituents may form a ring.

In the compound of the formula (I), when the amino group has a substituent, said substituent is a substituted or unsubstituted, and a saturated or unsaturated alkyl group, cycloalkyl group, alkoxy group, aryl group, acyl group, aroyl group or heterocyclic group, and two of adjacent these substituents may form a ring by combining with each other. As the halogen atom, there may be mentioned a chlorine atom, a bromine atom, an iodine atom or the like.

The above alkyl group may be further substituted by a suitable group (for example, a halogen atom, an alkoxy group, etc.).

Preferred alkyl group is that having 1 to 10 carbon atoms, more specifically, a methyl group, an ethyl group, an n-propyl group, an n-hexyl group, a trichloromethyl group, a vinyl group or the like.

The above cycloalkyl group is a cycloalkyl group having 3 to 10 carbon atoms or so, and may be further substituted by a suitable group (for example, an alkyl group, a halogen atom, an alkoxy group, etc.). Specific examples thereof may include a cyclohexyl group, a cyclopentyl group or the like.

The above alkoxy group may be a straight or branched one, and may be further substituted by a suitable group (for example, an alkyl group, a halogen atom, an alkoxy group, etc.). Preferred alkoxy group is that having 1 to 10 carbon atoms, more specifically, a methoxy group, an ethoxy group, an n-propoxy group, an n-hexyloxy group or the like.

As the above aryl group, an aromatic group such as a phenyl group, a naphthyl group or the like are preferred, and these aromatic groups may be substituted by a suitable group (for example, a halogen atom, an alkyl group, an alkoxy group, a nitro group, etc.).

As the above acyl group, a straight or branched acyl group having 1 to 6 carbon atoms may be mentioned, and specific examples thereof are a formyl group, an acetyl group, a propionyl group, a pivaloyl group or the like.

As an aryl group portion of the above aroyl group, an aromatic group such as a phenyl group, a naphthyl group or the like are preferably mentioned. These aromatic groups may be substituted by a suitable group (for example, a halogen atom, an alkyl group, an alkoxy group, a nitro group, etc.).

As the above heterocyclic group, there may be mentioned, for example, a substituted or unsubstituted pyridyl group, furyl group, thienyl group or the like.

Specific examples of the compound represented by the formula (I) are enumerated below.

AP1

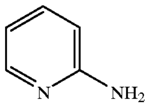

AP2

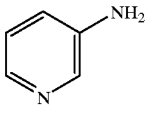

AP3

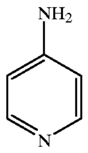

AP4

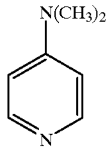

AP5

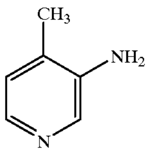

AP6

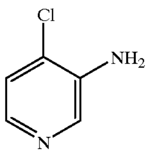

AP7

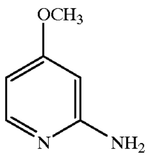

-continued

AP8

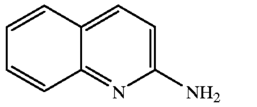

AP9

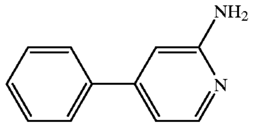

AP10

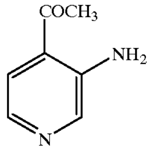

AP11

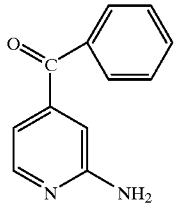

AP12

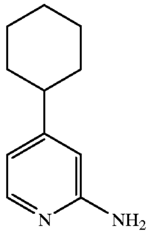

AP13

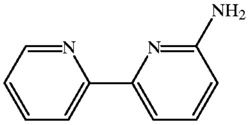

These silver halide solvent including the amine compounds as mentioned above are preferably used in an amount of 0.1 to 100-fold moles, more preferably 1 to 50-fold moles based on a gram ion number of the silver ion. These silver halide solvents are used singly or in combination of two or more.

The silver thin layer after physical development of the lithographic printing plate precursor according to the present invention is preferably modify the ink receptive property or strengthen the receptivity thereof by an optional known surfactant.

Such processing solutions are disclosed, for example in Japanese Patent Publication No. 29723/1973, U.S. Pat. No. 3,721,559 or the like.

In the present invention, in order to promote removal of the silver thin layer by laser beam irradiation and to improve efficiency (i.e., it can be said to be "sensitivity" of the lithographic printing plate precursor of the present invention) to expose the hydrophilic layer, a light-absorbing agent which absorbs laser beam may be added either to a support or a hydrophilic layer. According to this constitution, even if part of the laser beam transmitted through the silver thin layer, they are absorbed at the under layer so that thermal efficiency can be improved.

As the light-absorbing agent to be employed for the above object, there may be mentioned a usual dye or pigment having an absorption region at the laser beam exposure region, such as carbon black, graphite, copper sulfide, zinc sulfide, molybdenum trisulfide, black titanium dioxide, metal-free or metal phthalocyanine, polymethyne series dye (cyanine dye), azulenium dye, pyrylium, thiopyrylium dye, squarylium series dye, crocoonium series dye, thiol-nickel complex chlorine dye, mercaptophenol, mercaptonaphtol complex series dye, triarylmethane series dye, immonium, diimmonium series dye, anthraquinone series dye, or the like.

In the lithographic printing plate precursor according to the present invention, a hydrophilic polymer layer may be provided on the silver thin film. By providing such a hydrophilic polymer layer on the silver thin film, deterioration in sensitivity of the silver thin layer accompanied by modification of the surface of the layer with a lapse of time can be prevented. As the hydrophilic polymer to be used in the hydrophilic polymer layer, those optionally selected from the above-mentioned hydrophilic polymers to be used in the hydrophilic layer according to the present invention may be used. The hydrophilic polymer to be used in the hydrophilic polymer layer may be the same or different from that used in the hydrophilic layer, and may be single species or in combination of two or more kinds.

The thickness of the hydrophilic polymer layer to be provided on the silver thin film is preferably 0.01 to 0.5 $\mu$m. If the thickness of the hydrophilic polymer layer is less than 0.01 $\mu$m, there is little effect on stain prevention, while if it exceeds 0.5 $\mu$m, whereas the hydrophilic polymer has light transmittance at the infrared spectrum region, it causes bad effect on removal sensitivity of the silver thin layer and attachment of ink at the image area sometimes delayed so that it is not preferred.

In the present invention, it is preferred to add a hydrophobic compound in the hydrophilic polymer layer in an amount of 1 to 30% by weight based on the total weight of the hydrophilic polymer layer. If the amount of the hydrophobic compound in the hydrophilic polymer layer is within the above range, ink acceptability can be improved without substantially impairing removal efficiency of the silver thin film. Also, when granular silver particles having an average particle diameter of 0.005 to 0.2 $\mu$m is used, it can accept ink in itself, but by adding a hydrophobic compound to the hydrophilic polymer layer, ink acceptability can be stabilized.

As the hydrophobic compound to be used in the present invention, there may be mentioned, for example, phthalic acid ester such as diethyl phthalate, dibutyl phthalate, etc.; phosphoric acid ester such as tricresyl phosphate, etc.; known oils; and various kinds of animal oils and vegetable oils. Also, mercaptotetrazol derivatives having a hydrophobic group such as phenylmercaptotetrazole, etc. are also effective, and a hydrophobic compound having a mercapto group and at least one of a hydrophobic substituent is suitable. Examples of such a hydrophobic compounds may include, for example, in addition to the mercaptotetrazole derivatives such as phenylmercaptotetrazole, etc., a mercaptotriazole derivative represented by the following formula (II) and a mercaptoxadiazole derivative represented by the formula (III):

(II)

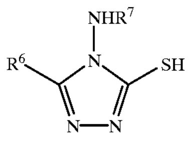

wherein $R^6$ represents an alkyl group, an aryl group or an aralkyl group; and $R^7$ represents a hydrogen atom or an acyl group.

(III)

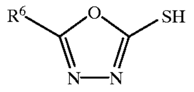

wherein $R^6$ has the same meaning as defined above.

In the above formula (II), $R^6$ is preferably an alkyl group having 3 to 16 carbon atoms.

Moreover, as the hydrophobic compound, a compound which gives ink receptivity is preferably used. Examples thereof are mentioned, for example, in Japanese Patent Publication No. 29723/1973, U.S. Pat. No. 3,721,559, and these compounds can be used for this purpose.

The hydrophilic polymer layer containing a hydrophobic compound can be formed, after forming the silver thin layer, by coating a composition for forming the layer on the silver thin layer. The hydrophobic compounds may be added to the aqueous hydrophilic polymer solution using a known oil dispersion technique or after dissolving in a suitable solvent and then added to the aqueous hydrophilic polymer solution. Also, the compound having a mercapto group and at least one of a hydrophobic substituent can be added to the hydrophilic polymer solution by dissolving it using an amine compound as described in Japanese Provisional Patent Publications No. 79982/1994 and No. 248630/1995.

Also, in the present invention, after exposing the hydrophilic layer, simultaneously with laser exposure or after laser exposure, UV exposure may be carried out at least to the hydrophilic layer. The UV exposure herein mentioned means irradiating UV rays with a wavelength of 450 nm or less, preferably about 250 to 390 nm. As a light source for irradiating UV rays, a mercury lamp or a metal halide lamp can be suitably used.

Inorganic oxides such as $TiO_2$, ZnO, $SnO_2$, $SrTiO_3$, $WO_3$, $Bi_2O_3$, and $Fe_2O_3$ has light absorption at the ultraviolet rays wavelength region. When these compounds are contained in the hydrophilic layer, the layer is made more hydrophilic. The mechanism of promoting the surface hydrophilic is described in detail in Japanese Provisional Patent Publication No. 140046/1998.

As the support to be used in the lithographic printing plate according to the present invention, there may be used, for example, paper, various kinds of films, plastics, paper coated by a resin-like substance, metals, and a laminate in which a polyester film or paper is laminated to either of the above-exemplified supports.

Among these, as a support of a film, a polyester film on which an organic copolymer is coated and a hydrophilic treatment is applied is preferred. For such a film, a surface treatment may be further carried out to enhance adhesiveness to the hydrophilic layer, and then a subbing layer comprising an organic polymer may be provided on the polyester film. As the support, there may be mentioned the following two types of films.

One of which is to coat a composition comprising an organic solvent which becomes a swelling agent or a dissolving agent of the polyester film and an organic copolymer (hereinafter referred to as the "solvent subbing method"). Examples thereof are mentioned in U.S. Pat. No. 2,830,030; British Patents No. 772,600, No. 776,157 and No. 785,789; and Japanese Provisional Patent Publications No. 1718/1975 and No. 8259/1975.

The other is to coat a composition in the form of an aqueous composition (so-called "latex") of an organic copolymer without substantially containing an organic solvent (hereinafter referred to as the "aqueous subbing method"). Examples thereof are mentioned in Japanese Patent Publications No. 13278/1969 and No. 10988/1970; Japanese Provisional Patent Publications No. 11118/1974, No. 27918/1976, No. 114670/1977, No. 11177/1979, No. 67745/1980, No. 169145/1983 and No. 77439/1984.

The above-mentioned solvent subbing method involves the problems that physical properties of the polyester film are deteriorated during subbing treatment or the organic solvent causes pollution or problems on safety or hygiene at operation. Thus, the subbing method is transferring to the aqueous subbing method. Also, for reinforcing adhesion, a support to which a thin film of gelatin with a coated amount of 0.02 to 0.1 $g/m^2$ is provided may be used.

To the surface of the support to be used in the present invention, a surface treatment may be carried out in order to improve adhesiveness to a layer coated as an upper layer or solid fine particles may be added to either of the layers provided on the support.

Also, at the opposite surface (back surface) of the support, which is an opposite surface to the surface on which the hydrophilic layer, etc. is/are provided, a layer containing a matte agent or an antistatic agent may be provided in view of conveyance, etc. in an imaging apparatus, etc.

In the present invention, as a laser to be used for exposing the hydrophilic layer which contains hydrophilic physical development nuclei layer by removing the silver thin layer, there may be mentioned a conventionally known laser including a gas laser such as a carbonic acid gas laser, a nitrogen laser, an Ar laser, an He/Ne laser, an He/Cd laser, a Kr laser or the like; a liquid (dye) laser; a solid laser such as a ruby laser, an Nd/YAG laser or the like; a semiconductor laser such as a GaAs/GaAlAs laser, InGaAs laser or the like; an eximer laser such as a KrF laser, a XeCl laser, a XeF laser, an $Ar_2$ laser or the like.

In the present invention, an efficiency of removing a silver thin layer (i.e., it can be said to be a sensitivity of a lithographic printing plate of the process of the present invention) depends on the thickness of the silver thin film. A thinner silver thin layer can be easily removed by runlength is lowered. Thus, it is preferred to determine the thickness of the silver thin layer according to the laser output power to be used for imaging. In a plate setter of a heat-mode system presently practiced, an output on the lithographic printing plate surface is 0.1 to 10 W, and when these plate setters are employed, a silver amount In the silver thin layer is preferably 0.1 $g/m^2$ to 1.5 $g/m^2$. As a general tendency, when a laser more than 1 W or more, or when a printing plate for a long run is to be obtained, the silver amount may be set with a relatively larger amount. Also, when sensitivity is more important than runlength, that is, when a laser not more than 1 W is used, the silver amount is preferable set with a relatively less amount.

EXAMPLES

In the following, the present invention is explained in detail by referring to Examples, but the present invention is not limited by the following Examples so long as not exceeding the scope of the present invention. Incidentally, for calculating a weight ratio of the inorganic oxide, a solid component described in a brochure is used.

Example 1

On one surface of a PET (polyethylene terephthalate) film having a thickness of 175 μm and having a 0.04 g/$m^2$ gelatin subbing layer, a solution of colloidal silica (available from Nissan Chemical Industries, Ltd., average particle size: 0.004 to 0.006 μm, 30% sol) and polyvinyl alcohol with a weight ratio of the colloidal silica being 80% was so coated to form a hydrophilic layer with a solid content of 2 g/$m^2$ and dried.

Next, on the hydrophilic layer, a nuclei coating solution described in Example 2 of Japanese Provisional Patent Publication No. 21602/1978 (as physical development nuclei, palladium sulfide is contained, and as a hydrophilic polymer, No. 3 copolymer described in the above-mentioned publication comprising acrylamide and imidazole which polymer is contained is used in a coated amount of 4 mg/$m^2$) is coated and dried.

By maintaining an aqueous solution of inactive gelatin at 60° C. while vigorously stirring, a mixed aqueous solution of sodium chloride and potassium bromide (potassium bromide: 29.5 mole %) and an aqueous silver nitrate solution were simultaneously added thereto to prepare a silver chlorobromide emulsion having an average particle size of 0.28 μm. Then, potassium iodide in an amount corresponding to 0.5 mole %/mole Ag was added to subject to surface substitution. An emulsion containing these silver halide emulsion particles was coated on the above-mentioned support in a silver nitrate amount of 3 g/$m^2$ and dried to obtain a lithographic printing material. The silver halide emulsion was a monodispersed silver chloroiodobromide emulsion comprising 70% of silver chloride, 29.5% of silver bromide, and 0.5% of silver iodide, and 90% by weight of the whole particles are within the average particle size ±30%.

The thus obtained lithographic printing material was developed for 15 seconds without exposure with a developing solution obtained by adding 40 ml/l of N-methylethanolamine to the diffusion transfer developing solution described in Example 1 of Japanese Provisional Patent Publication No. 282295/1992, and the gelatin layer was washed off with a flowing water immediately after development to obtain Lithographic printing plate precursor 1 in which the silver thin layer was exposed.

When an amount of silver of the thus prepared Lithographic printing plate precursor 1 was measured by a fluorescent X-ray device (manufactured by K.K. Rigaku, 3270, trade name), it was 0.80 g/$m^2$.

Next, the silver thin layer was photographed by a scanning type electron microscope. Thus, it can be found that it comprises granular silver particles, and when the size thereof is measured, it can be found that it is within the range of 0.005 to 0.2 μm.

The hydrophilic layer of this Lithographic printing plate precursor 1 was exposed to a semiconductor laser with a wavelength of 830 nm and an output of 0.5 W to obtain a lithographic printing plate (Lithographic printing plate 1). This Lithographic printing plate 1 was mounted on an offset printer (3200MCD, trade name, manufactured by Ryobi Imagics Co.), an etching solution (SLM-OH, trade name, manufactured by Mitsubishi Paper Mills Ltd.) was spread all over the surface of the plate, and printing was carried out by using New Champion Black N (trade name, available from Dainippon Ink Co.) as an ink. As a result, printed materials excellent in printing image quality without stain at a non-image area could be obtained from initiation of printing. Moreover, no stain was occurred finally at printing of 10,000 sheets and printed materials excellent in printing image quality could be obtained.

Example 2

In the same manner as in Example 1 except for using zirconia (available from Nissan Chemical Industries, Ltd., average particle size: 0.03 μm, 15% sol) in place of colloidal silica, a lithographic printing plate precursor 2 was prepared. Then, in the same manner as in Example 1, Lithographic printing plate 2 was prepared.

By using Lithographic printing plate 2, when evaluation of printing was carried out in the same manner as in Example 1, it showed printability excellent in stain resistance as in Lithographic printing plate 1.

Example 3

In the same manner as in Example 1 except for using titania (available from Nissan Chemical Industries, Ltd., average particle size: 0.03 μm, 13% sol) in place of colloidal silica, a lithographic printing plate precursor 3 was prepared. Then, in the same manner as in Example 1, Lithographic printing plate 3 was prepared.

By using Lithographic printing plate 3, when evaluation of printing was carried out in the same manner as in Example 1, it showed printability excellent in stain resistance as in Lithographic printing plate 1.

Example 4

In the same manner as in Example 1 except for using δ alumina (available from Nippon Aerosil K.K., average particle size: 0.012 μm, 20% sol) in place of colloidal silica, a lithographic printing plate precursor 4 was prepared. Then, in the same manner as in Example 1, Lithographic printing plate 4 was prepared.

By using Lithographic printing plate 4, when evaluation of printing was carried out in the same manner as in Example 1, it showed printability excellent in stain resistance as in Lithographic printing plate 1.

Comparative Example 1

In the same manner as in Example 1 except for not using colloidal silica and preparing a hydrophilic layer with polyvinyl alcohol alone, Lithographic printing plate a was prepared.

By using Lithographic printing plate a, when printing was carried out in the same manner as in Example 1, a stripe shaped stain occurred at the non-image area and printing was continued by 1,000 sheets, but the stain did not disappeared. The printer was stopped, and ink on the plate surface was wiped with an etching solution and restarted printing. Then, the degree of the stain was slightly reduced than before, but excellent printed materials could not be obtained.

Comparative Example 2

In the same manner as in Comparative example 1 except for using gelatin in place of polyvinyl alcohol, Lithographic printing plate b was prepared.

By using Lithographic printing plate b, when printing was carried out in the same manner as in Example 1, a stripe shaped stain occurred at the non-image area as in Comparative example 1 and printing was continued by 1,000 sheets, but the stain did not disappeared. The printer was stopped, and ink on the plate surface was wiped with an etching solution and restarted printing. Then, the degree of the stain was slightly reduced than before, but excellent printed materials could not be obtained.

Example 5

In the same manner as in Example 1 except for using silica (available from Fuji Silisia Chemical K.K., average particle size: 2.2 to 2.9 μm) in place of colloidal silica, Lithographic printing plate 5 was prepared.

By using Lithographic printing plate 5, when evaluation of printing was carried out in the same manner as in Example 1, dot shaped stain occurred at the non-image area at initiation of printing. The printer was once stopped and the plate surface was wiped, and printing was restarted. Then, no dot shaped stain occurred and good printed materials can be obtained.

Example 6

In the same manner as in Example 1 except for using titanium oxide (available from Ishihara Sangyo K.K., average particle size: 0.2 to 0.4 μm) in place of colloidal silica, Lithographic printing plate 6 was prepared.

By using Lithographic printing plate 6, when evaluation of printing was carried out in the same manner as in Example 1, dot shaped stain occurred at the non-image area at initiation of printing. However, this stain was naturally disappeared during printing and good printed materials can be obtained without recurring the stain.

Example 7

In the same manner as in Example 1 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 $mg/m^2$) to which colloidal silica (available from Nissan Chemical Industries, Ltd., average particle size: 0.004 to 0.006 μm, 30% sol) was added so as to become an amount of 0.1 $g/m^2$, Lithographic printing plate 7 was prepared.

By using Lithographic printing plate 7, when evaluation of printing was carried out in the same manner as in Example 1, it showed printability excellent in stain resistance as in Lithographic printing plate 1.

Example 8

In the same manner as in Example 1 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 $mg/m^2$) to which zirconia (available from Nissan Chemical Industries, Ltd., average particle size: 0.03 μm, 15% sol) was added so as to become an amount of 0.1 $g/m^2$, Lithographic printing plate 8 was prepared.

By using Lithographic printing plate 8, when evaluation of printing was carried out in the same manner as in Example 1, it showed printability excellent in stain resistance as in Lithographic printing plate 1.

Example 9

In the same manner as in Example 1 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained in an amount of 4 $mg/m^2$) to which titania (available from Nissan Chemical Industries, Ltd., average particle size: 0.03 μm, 13% sol) was added so as to become an amount of 0.1 $g/m^2$, Lithographic printing plate 9 was prepared.

By using Lithographic printing plate 9, when evaluation of printing was carried out in the same manner as in Example 1, it showed printability excellent in stain resistance as in Lithographic printing plate 1.

Example 10

In the same manner as in Example 1 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 $mg/m^2$) to which δ alumina (available from Nippon Aerosil K.K., average particle size: 0.012 μm, 20% sol) was added so as to become an amount of 0.1 $g/m^2$, Lithographic printing plate 10 was prepared.

By using Lithographic printing plate 10, when evaluation of printing was carried out in the same manner as in Example 1, it showed printability excellent in stain resistance as in Lithographic printing plate 1.

Example 11

In the same manner as in Example 2 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 $mg/m^2$) to which colloidal silica (available from Nissan Chemical Industries, Ltd., average particle size: 0.004 to 0.006 μm 30% sol) was added so as to become an amount of 0.1 $g/m^2$, Lithographic printing plate 11 was prepared.

By using Lithographic printing plate 11, when evaluation of printing was carried out in the same manner as in Example 1, it showed printability excellent in stain resistance as in Lithographic printing plate 1.

Example 12

In the same manner as in Example 3 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 $mg/m^2$) to which colloidal silica (available from Nissan Chemical Industries, Ltd., average particle size: 0.004 to 0.006 μm, 30% sol) was added so as to become an amount of 0.1 $g/m^2$, Lithographic printing plate 12 was prepared.

By using Lithographic printing plate 12, when evaluation of printing was carried out in the same manner as in Example 1, it showed printability excellent in stain resistance as in Lithographic printing plate 1.

Example 13

In the same manner as in Example 4 except for using a nuclei coating solution described in Example 2 of Japanese Provisional Patent Publication No. 21602/1978 (as physical development nuclei, palladium sulfide is contained, and as a hydrophilic polymer, No. 3 copolymer described in said publication comprising acrylamide and imidazole which polymer is contained is used in a coated amount of 4 mg/$m^2$) to which colloidal silica (available from Nissan Chemical Industries, Ltd., average particle size: 0.004 to 0.006 $\mu$m, 30% sol) was added so as to become an amount of 0.1 g/$m^2$, Lithographic printing plate 13 was prepared.

By using Lithographic printing plate 13, when evaluation of printing was carried out in the same manner as in Example 1, it showed printability excellent in stain resistance as in Lithographic printing plate 1.

Example 14

In the same manner as in Example 1 except that a hydrophilic layer in which the ratio of colloidal silica and polyvinyl alcohol in Example 1 was changed to 90% by weight of colloidal silica was provided, Lithographic printing plate 14 was prepared.

By using Lithographic printing plate 14, when evaluation of printing was carried out in the same manner as in Example 1, it showed printability excellent in stain resistance as in Lithographic printing plate 1.

Example 15

In the same manner as in Example 1 except that a hydrophilic layer in which the ratio of colloidal silica and polyvinyl alcohol in Example 1 was changed to 55% by weight of colloidal silica was provided, Lithographic printing plate 15 was prepared.

By using Lithographic printing plate 15, when evaluation of printing was carried out in the same manner as in Example 1, it showed printability excellent in stain resistance as in Lithographic printing plate 1.

Example 16

In the same manner as in Example 2 except that a hydrophilic layer in which the ratio of zirconia and polyvinyl alcohol in Example 2 was changed to 90% by weight of zirconia was provided, Lithographic printing plate 16 was prepared.

By using Lithographic printing plate 16, when evaluation of printing was carried out in the same manner as in Example 1, it showed printability excellent in stain resistance as in Lithographic printing plate 1.

Example 17

In the same manner as in Example 2 except that a hydrophilic layer in which the ratio of zirconia and polyvinyl alcohol in Example 2 was changed to 55% by weight of zirconia was provided, Lithographic printing plate 17 was prepared.

By using Lithographic printing plate 17, when evaluation of printing was carried out in the same manner as in Example 1, it showed printability excellent in stain resistance as in Lithographic printing plate 1.

Example 18

By using the Lithographic printing plates 14 to 17, ink/water responses of these plates were measured. Ink/water response was measured by using a printer and ink used in Example 1, stopping feed of water during printing, winding ink to the plate to compulsory stain the plate, feeding damping water to the plate and a number of papers at which stain at the non-image area is disappeared was counted. The results are shown in Table 1.

TABLE 1

| Lithographic printing plate | 14 | 15 | 16 | 17 |
|---|---|---|---|---|
| Ink/water response | ○ | Δ | ○ | Δ |

○: Stain disappeared within 20 sheets of papers.
Δ: Stain disappeared within 20 to 50 sheets of papers.
x: More than 50 sheets of papers are required until stain disappears.

Examples 19 to 22

In the same manner as in Example 1 except that hydrophilic layers were each provided so that the weight ratios of colloidal silica in Example 1 based on the total amount of colloidal silica and polyvinyl alcohol are 20% and 40% by weight, to prepare Lithographic printing plates 18 and 19, respectively. Moreover, in the same manner as in Example 2 except that hydrophilic layers were each provided so that the weight ratios of zirconia in Example 2 based on the total amount of zirconia and polyvinyl alcohol are 40% and 20% by weight, to prepare Lithographic printing plates 20 and 21, respectively.

By using these Lithographic printing plates 18 to 21, when printing qualities thereof were evaluated in the same manner as in Example 1, it was found that all Lithographic printing plates showed printability excellent in stain resistance as in Lithographic printing plate 1.

Next, by using these Lithographic printing plates 18 to 21, ink/water responses thereof were measured in the same manner as in Example 18. As a result, ink/water responses at the time of initiating printing, each required 50 sheets or more until stain disappears and a weight ratio of the inorganic oxide was slightly bad as compared with 80% of Examples land 2. However, once the stain disappeared, no stain occurred again. Thus, in the printing evaluation, all the Lithographic printing plates 18 to 21 showed printability excellent in stain resistance as in Examples 1 and 2.

Example 23

Before effecting printing by using Lithographic printing plate 2, UV exposure was carried out by using UV lamp F300 (trade name, available from Fusion Japan K.K.) to prepare Lithographic printing plate 22.

By using this Lithographic printing plate 22, when evaluation of printing was carried out in the same manner as in Example 1, it showed printability excellent in stain resistance as in Lithographic printing plate 1.

Example 24

In the same manner as in Example 23 except for using Lithographic printing plate 3, Lithographic printing plate 23 was prepared.

By using this Lithographic printing plate 23, when evaluation of printing was carried out in the same manner as in Example 1, it showed printability excellent in stain resistance as in Lithographic printing plate 1.

Example 25

During laser beam exposure of Lithographic printing plate 2, UV exposure was simultaneously carried out by using UV lamp F300 (trade name, available from Fusion Japan K.K.) to prepare Lithographic printing plate 24.

By using this Lithographic printing plate 24, when evaluation of printing was carried out in the same manner as in Example 1, it showed printability excellent in stain resistance as in Lithographic printing plate 1.

Example 26

In the same manner as in example 25 except for using Lithographic printing plate 3 in place of using Lithographic printing plate 2, Lithographic printing plate 25 was prepared.

By using this Lithographic printing plate 25, when evaluation of printing was carried out in the same manner as in Example 1, it showed printability excellent in stain resistance as in Lithographic printing plate 1.

Example 27

By using Lithographic printing plates 2 and 3 and Lithographic printing plates 22 to 25, stain tests were carried out under severer conditions than Example 1. The stain printing test was carried out by using, as an etching solution, SLM-OD30 (trade name, available from Mitsubishi Paper Mills Limited) which had been diluted twice than the usual prescription, and using the printer and ink used in Example 1. The result are shown in Table 2.

TABLE 2

| Lithographic printing plate | 2 | 3 | 22 | 23 | 24 | 25 |
|---|---|---|---|---|---|---|
| Stain test | Δ | Δ | ○ | ○ | ○ | ○ |

○: No stain occurred.
Δ: Stain appears at initiating printing but not occurred thereafter.
x: Stain occurs throughout the printing.

Example 28

On the silver thin layer of Lithographic printing plate 1 prepared in Example 1, the following overcoating solution (a coating solution for forming a hydrophilic polymer layer) was so coated that a wet component coated amount of 15 g/m$^2$ followed by drying. At this time, the thickness of the hydrophilic layer was about 0.2 $\mu$m.

Overcoating Solution 1

| | |
|---|---|
| Gum Arabic | 10 g |
| 85% phosphoric acid | 1 g |
| Water | 900 ml |

Adjusted to pH=7.0±0.1 by adding 1 N aqueous sodium hydroxide solution.

The above mixture was made up to 1,000 ml by further adding water.

By using Lithographic printing plate precursor 26 in which the hydrophilic polymer layer had been provided on the silver thin layer, laser beam exposure was carried out in the same manner as in Example 1 to prepare Lithographic printing plate 26.

By using this Lithographic printing plate 26, when evaluation of printing was carried out in the same manner as in Example 1, it showed printability excellent in stain resistance as in Lithographic printing plate 1.

Example 29

In the same manner as in Example 2 except that the above-mentioned overcoating solution (a coating solution for forming a hydrophilic polymer layer) was coated on the silver thin layer of Lithographic printing plate 2 prepared in Example 2 so that a wet component coated amount of 15 g/m$^2$ followed by drying to provide a hydrophilic polymer layer having a thickness of about 0.2 $\mu$m. Thus, Lithographic printing plate precursor 27 was prepared as in Example 2 and it was subjected to laser exposure to obtain Lithographic printing plate 27.

By using this Lithographic printing plate 27, when evaluation of printing was carried out in the same manner as in Example 1, it showed printability excellent in stain resistance as in Lithographic printing plate 1.

Example 30

In the same manner as in Example 3 except that the above-mentioned overcoating solution (a coating solution for forming a hydrophilic polymer layer) was coated on the silver thin layer of Lithographic printing plate 3 prepared in Example 3 so that a wet component coated amount of 15 g/m$^2$ followed by drying to provide a hydrophilic polymer layer having a thickness of about 0.2 $\mu$m. Thus, Lithographic printing plate precursor 28 was prepared as in Example 3 and it was subjected to laser exposure to obtain Lithographic printing plate 28.

By using this Lithographic printing plate 28, when evaluation of printing was carried out in the same manner as in Example 1, it showed printability excellent in stain resistance as in Lithographic printing plate 1.

Example 31

In the same manner as in Example 4 except that the above-mentioned overcoating solution (a coating solution for forming a hydrophilic polymer layer) was coated on the silver thin layer of Lithographic printing plate 4 prepared in Example 4 so that a wet component coated amount of 15 g/m$^2$ followed by drying to provide a hydrophilic polymer layer having a thickness of about 0.2 $\mu$m. Thus, Lithographic printing plate precursor 29 was prepared as in Example 4 and it was subjected to laser exposure to obtain Lithographic printing plate 29.

By using this Lithographic printing plate 29, when evaluation of printing was carried out in the same manner as in Example 1, it showed printability excellent in stain resistance as in Lithographic printing plate 1.

Examples 32 to 35

In the same manner as in Examples 28 to 31 except for providing the hydrophilic polymer layer having a thickness of about 0.6 $\mu$m by coating the overcoating solution 1 repeatedly to prepare Lithographic printing plates 30, 31, 32 and 33, respectively. To these Lithographic printing plates 30 to 33, exposure was carried out with a semiconductor laser with a wavelength of 830 nm and a power of 0.5 W, but removal of the silver thin layers at the non-image area were insufficient and the silver thin layers remained with a stripe shape. Also, when printing was carried out in the same manner as in Example 1 by using the above Lithographic printing plates 30 to 33, stripe-shaped stains occurred at the non-image portion at initiating the printing. However, when the printer was stopped, the plate surface was wiped and printing was restarted, then the stripe-shaped stain was disappeared in the respective Lithographic printing plates.

Example 36

In the same manner as in Example 28 except for changing the overcoating solution 1 prepared in Example 28 with the following overcoating solution 2, Lithographic printing plate precursor 34 was prepared from Lithographic printing plate precursor 1 prepared in Example 1, and Lithographic printing plate 34 was prepared by exposure.

By using this Lithographic printing plate 34, when evaluation of printing was carried out in the same manner as in Example 1, it showed printability excellent in stain resistance as in Lithographic printing plate 1.

Overcoating Solution 2

| | | |
|---|---|---|
| Monoethanolamine | 5 | g |
| 3-n-Octyl-5-mercaptoxazole | 0.2 | g |
| Gum Arabic | 10 | g |
| Sodium dihydrogen phosphate | 10 | g |
| 85% phosphoric acid | 1 | g |
| Water | 900 | ml |

Adjusted to pH=7.0±0.1 by adding 1 N aqueous sodium hydroxide solution.

The above mixture was made up to 1,000 ml by further adding water.

Example 37

In the same manner as in Example 29 except for changing the overcoating solution 1 prepared in Example 29 with the above overcoating solution 2, Lithographic printing plate precursor 35 was prepared from Lithographic printing plate precursor 2 prepared in Example 2, and Lithographic printing plate 35 was prepared by exposure.

By using this Lithographic printing plate 35, when evaluation of printing was carried out in the same manner as in Example 1, it showed printability excellent in stain resistance as in Lithographic printing plate 1.

Example 38

In the same manner as in Example 30 except for changing the overcoating solution 1 prepared in Example 30 with the above overcoating solution 2, Lithographic printing plate precursor 36 was prepared from Lithographic printing plate precursor 3 prepared in Example 3, and Lithographic printing plate 36 was prepared by exposure.

By using this Lithographic printing plate 36, when evaluation of printing was carried out in the same manner as in Example 1, it showed printability excellent in stain resistance as in Lithographic printing plate 1.

Example 39

In the same manner as in Example 31 except for changing the overcoating solution 1 prepared in Example 31 with the above overcoating solution 2, Lithographic printing plate precursor 37 was prepared from Lithographic printing plate precursor 4 prepared in Example 4, and Lithographic printing plate 37 was prepared by exposure.

By using this Lithographic printing plate 37, when evaluation of printing was carried out in the same manner as in Example 1, it showed printability excellent in stain resistance as in Lithographic printing plate 1.

Example 40

By using Lithographic printing plates 26 to 29 and 34 to 37 prepared as mentioned above, stain tests were carried out under the conditions of easily causing stain as in Example 27. The results are shown in Table 3.

TABLE 3

| Lithographic printing plate | 26 | 27 | 28 | 29 | 34 | 35 | 36 | 37 |
|---|---|---|---|---|---|---|---|---|
| Stain test | ○ | ○ | ○ | ○ | ○ | ○ | ○ | ○ |

○: No stain occurred.
Δ: Stain appears at initiating printing but not occurred thereafter.
x: Stain occurs throughout the printing.

Example 41

By using Lithographic printing plate precursors 1 to 4, Lithographic printing plate precursors 26 to 29 and Lithographic printing plate precursors 34 to 37, laser beam exposure was carried out after one week from the day when the silver thin layers were prepared to prepare Lithographic printing plates 1A to 4A, 26A to 29A and 34A to 37A, respectively. Moreover, laser beam exposure was carried out after one month from the day when the silver thin layers were prepared to prepare Lithographic printing plates 1B to 4B, 26B to 29B and 34B to 37B, respectively. Next, printing characteristics thereof were examined.

As a result, in samples prepared after one week, all the Lithographic printing plates 1A to 4A, 26A to 29A and 34A to 37A are good in stain, but in Lithographic printing plates 1A to 4A, an ink density at the image area was lowered. Also, in samples prepared after one month, no specific problem occurred in stain, but in Lithographic printing plates 1B to 4B, an ink density at the image area was further lowered, and also in Lithographic printing plates 26B to 29B, lowering in ink density at the image area was slightly observed. However, in Lithographic printing plates 34B to 37B, no lowering in density at the image area was observed and excellent printed matter can be obtained.

Example 42

In the same manner as in Example 36 except for using a paper base (thickness: 175 μm) coated by polyethylene having a gelatin subbing layer with 0.04 $g/m^2$ as a support, Lithographic printing plate 38 was prepared.

By using this Lithographic printing plate 38, when evaluation of printing was carried out in the same manner as in Example 1, it showed printability excellent in stain resistance as in Lithographic printing plate 1.

Example 43

In the same manner as in Example 37 except for using a paper base (thickness: 175 μm) coated bypolyethylene having a gelatin subbing layer with 0.04 $g/m^2$ as a support, Lithographic printing plate 39 was prepared.

By using this Lithographic printing plate 39, when evaluation of printing was carried out in the same manner as in Example 1, it showed printability excellent in stain resistance as in Lithographic printing plate 1.

Examples 44 to 46

Lithographic printing plate precursors were prepared in the same manner as in Example 1 except for changing a coated amount of the emulsion layer to a silver nitrate amount of 5 $g/m^2$ and developing time to 5 seconds, 20 seconds and 15 seconds, respectively, and the above-mentioned overcoating solution 2 was coated with a thickness of about 0.2 μm (Lithographic printing plate precursors 40, 41 and 42, respectively). Next, silver amounts of these Lithographic printing plate precursors 40, 41 and 42 were measured in the same manner as in Example 1. The results of silver amounts measured were shown in Table 4.

TABLE 4

| Lithographic printing plate | 40 | 41 | 42 |
|---|---|---|---|
| Silver amount ($g/m^2$) | 0.23 | 1.41 | 0.67 |

By using these Lithographic printing plate precursors 40, 41 and 42, respective hydrophilic layers were exposed by a semiconductor laser with a wavelength of 830 nm and a power of 0.5 W in the same manner as in Example 1 to obtain Lithographic printing plates 40 to 42, respectively.

Next, in the same manner as in Example 1, printing was carried out by using the above Lithographic printing plates 40 to 42. In Lithographic printing plate 42, as in Example 1, printed matter excellent in printing quality without any stain at the non-image area can be obtained from initiation of printing. Also, no stain occurred finally with 10,000 sheets of printing and printed matter excellent in printing quality can be obtained. In Lithographic printing plate 40, printed matter excellent in printing quality without any stain at the non-image area can be obtained from initiation of printing. However, in printing up to 10,000 sheets, missing of a fine line at the image area was observed. In Lithographic printing plate 41, stain occurred at the non-image area at initiation of printing but the stain shortly disappeared. Thereafter, the stain did not recur up to 10,000 sheets of printing and printed matter excellent in printing quality can be obtained.

Examples 47 to 49

Lithographic printing plate precursors were prepared in the same manner as in Example 2 except for changing coated amount of the emulsion layer to a silver nitrate amount of 5 $g/m^2$ and developing time to 5 seconds, 20 seconds and 15 seconds, respectively, and the above-mentioned overcoating solution 2 was coated with a thickness of about 0.2 $\mu$m (Lithographic printing plate precursors 43, 44 and 45, respectively). Next, silver amounts of these Lithographic printing plate precursors 43, 44 and 45 were measured in the same manner as in Example 1. The results of silver amounts measured were shown in Table 5.

TABLE 5

| Lithographic printing plate | 43 | 44 | 45 |
|---|---|---|---|
| Silver amount ($g/m^2$) | 0.15 | 1.38 | 0.49 |

By using these Lithographic printing plate precursors 43, 44 and 45, respective hydrophilic layers were exposed by a semiconductor laser with a wavelength of 830 nm and a power of 0.5 W in the same manner as in Example 1 to obtain Lithographic printing plates 43 to 45, respectively.

Next, in the same manner as in Example 1, printing was carried out by using the above Lithographic printing plates 43 to 45. In Lithographic printing plate 45, as in Example 1, printed matter excellent in printing quality without any stain at the non-image area can be obtained from initiation of printing. Also, no stain occurred finally with 10,000 sheets of printing and printed matter excellent inprinting quality can be obtained. In Lithographic printing plate 43, printed matter excellent in printing quality without any stain at the non-image area can be obtained from initiation of printing. However, in printing up to 10,000 sheets, missing of a fine line at the image area was observed. In Lithographic printing plate 44, stain occurred at the non-image area at initiation of printing but the stain shortly disappeared. Thereafter, the stain did not recur up to 10,000 sheets of printing and printed matter excellent in printing quality can be obtained.

Examples 50 to 52

By using Lithographic printing plate precursors 40 to 42 prepared in Examples 44 to 46, image was formed by using a YAG laser with a wavelength of 1064 nm and a power of 8 W in place of the semiconductor laser used in Examples 44 to 46 to prepare Lithographic printing plates 40A to 42A, respectively. Printing was carried out in the same manner as in Example 1 by using Lithographic printing plates 40A to 42A. The results are shown in Table 6.

TABLE 6

| Lithographic printing plate | 40A | 41A | 42A |
|---|---|---|---|
| Printing stain | ○ | Δ | ○ |
| Missing of image | Δ | ○ | ○ |

Printing stain
○: No stain at non-image area and thus good.
Δ: Stain occurred at initiation of printing but thereafter good.
x: Stain occured throughout the printing.
Missing of image
○: No missing of image at image area and thus good.
Δ: No missing of image up to 2,000 sheets of printing and thus good.
x: Missing of image occurred within 2,000 sheets of printing.

Examples 53 to 57

By using Lithographic printing plate precursors 43 to 45 prepared in Examples 47 to 49, image was formed by using a YAG laser with a wavelength of 1064 nm and a power of 8 W in place of the semiconductor laser used in Examples 47 to 49 to prepare Lithographic printing plates 43A to 45A, respectively. Printing was carried out in the same manner as in Example 1 by using Lithographic printing plates 43A to 45A. The results are shown in Table 7.

TABLE 7

| Lithographic printing plate | 43A | 44A | 45A |
|---|---|---|---|
| Printing stain | ○ | Δ | ○ |
| Missing of image | Δ | ○ | ○ |

Printing stain
○: No stain at non-image area and thus good.
Δ: Stain occurred at initiation of printing but thereafter good.
x: Stain occured throughout the printing.
Missing of image
○: No missing of image at image area and thus good.
Δ: No missing of image up to 2,000 sheets of printing and thus good.
x: Missing of image occurred within 2,000 sheets of printing.

As explained above, in the process for making a lithographic printing plate of the present invention, the operation can be carried out under a room light and operation surroundings are extremely good since no developing solution is used. Also, the process can respond to the direct imaging method by a laser beam whereby an excellent effect can be obtained that an image with high resolution can be obtained with a lowcost. Moreover, a lithographic printing plate excellent in ink/water response can be provided.

What is claimed is:

1. A process for making a lithographic printing plate which comprises subjecting a lithographic printing plate precursor having at least a hydrophilic layer on a support and a silver thin layer on said hydrophilic layer to exposure by a laser beam thereby imagewisely removing said silver thin layer and exposing said hydrophilic layer, wherein the hydrophilic layer adjacent to said silver thin layer contains at least one inorganic oxide in particulate form, having a particle size of 0.001 to 0.1 μm.

2. The process for making a lithographic printing plate according to claim 1, wherein the inorganic oxide is at least one of an oxide of elements selected from the group consisting of aluminum, silicon, zirconium and titanium.

3. The process for making a lithographic printing plate according to claim 1, wherein imaging is carried out by using a laser having an output power on said lithographic printing plate precursor of 0.1 to 10 W, and a silver amount in said silver thin layer is 0.1 to 1.5 $g/m^2$.

4. The process for making a lithographic printing plate according to claim 1, wherein the silver thin layer comprises a physical development silver formed by the silver complex diffusion transfer process.

5. The process for making a lithographic printing plate according to claim 4, wherein the silver thin layer is formed by providing a hydrophilic physical development nuclei layer containing an oxide of at least one element selected from the group consisting of aluminum, silicon, zirconium and titanium, and a silver halide emulsion layer on a support in this order, subjecting to developing treatment by the silver complex diffusion transfer process without effecting exposure, and subjecting to wash-off the silver halide emulsion layer.

6. The process for making a lithographic printing plate according to claim 1, wherein the inorganic oxide in said hydrophilic layer is contained in an amount of 50% by weight or more.

7. The process for making a lithographic printing plate according to claim 1, wherein the silver thin layer is constituted by granular silver particles having an average particle size of 0.005 to 0.2 μm.

8. The process for making a lithographic printing plate according to claim 7, wherein said granular silver particles are formed in the presence of a silver halide solvent.

9. The process for making a lithographic printing plate according to claim 8, wherein said silver halide solvent is an amine compound.

10. The process for making a lithographic printing plate according to claim 9, wherein said amine compound is a compound represented by the formula (I):

(I)

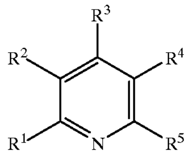

wherein at least one of $R^1$, $R^2$, $R^3$, $R^4$ and $R^5$ represents a substituted or unsubstituted amino group; and the remaining substituents each represent a hydrogen atom, a halogen atom, a substituted or unsubstituted saturated or unsaturated alkyl group, cycloalkyl group, alkoxy group, aryl group, acyl group, aroyl group or heterocyclic group, or adjacent two of these substituents may form a ring.

11. The process for making a lithographic printing plate according to claim 1, wherein a second hydrophilic layer of polymer having a thickness of 0.01 to 0.5 μm is further provided on said silver thin layer.

12. The process for making a lithographic printing plate according to claim 11, wherein said second hydrophilic layer contains 1 to 30% by weight of a hydrophobic compound.

13. The process for making a lithographic printing plate according to claim 12, wherein said hydrophobic compound is a compound having a mercapto group and at least one of a hydrophobic substituent.

14. The process for making a lithographic printing plate according to claim 1, wherein UV exposure is carried out after exposing said hydrophilic layer.

15. The process for making a lithographic printing plate according to claim 1, wherein UV exposure is carried out to the lithographic printing plate precursor after laser beam exposure and before initiation of printing.

16. The process for making a lithographic printing plate according to claim 1, wherein UV exposure is carried out to the lithographic printing plate precursor during laser beam exposure.

17. The process for making a lithographic printing plate according to claim 1, wherein the support is a film or a polyethylene-coated paper.

* * * * *